United States Patent [19]

Koetsch

[11] 4,067,055
[45] Jan. 3, 1978

[54] HIGH-SPEED INDUCTANCE DRIVER

[75] Inventor: Philip W. Koetsch, San Diego, Calif.

[73] Assignee: NCR Corporation, Dayton, Ohio

[21] Appl. No.: 735,662

[22] Filed: Oct. 26, 1976

[51] Int. Cl.$^2$ ............................................. H01H 47/32
[52] U.S. Cl. .................................... 361/159; 361/152
[58] Field of Search ................ 361/139, 152, 159, 160

[56] References Cited

U.S. PATENT DOCUMENTS

| | | | |
|---|---|---|---|
| 2,866,925 | 12/1958 | Wunderman | 361/160 |
| 3,089,960 | 5/1963 | Bailey | 307/43 |
| 3,149,244 | 9/1964 | Barnes et al. | 361/152 X |
| 3,189,796 | 6/1965 | Tipton | 361/159 |
| 3,449,639 | 6/1969 | Brown et al. | 361/155 |
| 3,560,821 | 2/1971 | Beling | 318/138 |

Primary Examiner—Harry E. Moose, Jr.
Attorney, Agent, or Firm—J. T. Cavender; Edward Dugas

[57] ABSTRACT

The circuit utilizes a tertiary transformer for coupling a driving current to an inductive load. A switching transistor in series with the primary winding of the tertiary transformer initiates current flow thru the primary winding, which current, in turn, induces a current in the secondary winding of the tertiary transformer. The inductive load is connected across the secondary winding. The tertiary winding of the transformer is serially connected by a back-biased diode between the driving power source and a reference potential so as to quickly dissipate the energy stored in the secondary winding and the inductive load back to the driving power source when current in the primary winding ceases.

6 Claims, 1 Drawing Figure

HIGH-SPEED INDUCTANCE DRIVER

BACKGROUND OF THE INVENTION

In the field of high-speed printing devices which are especially suitable for use in connection with electronic business systems, solenoid driving circuits receive extensive use. These driving circuits are used for activating printer hammers and the solenoids of wire matrix type printers. Such circuits require rapid cycling times because the cycle times of these circuits are a direct function of the speed at which printing may be accomplished.

A prior art patent of interest for setting out the state of the art is U.S. Pat. No. 3,089,960, entitled "Electrical Drive Circuit", by G. G. Bailey. The drive circuit of the aforementioned patent divides the primary winding of a transformer into at least two portions which are inductively coupled to the secondary winding. Activation of a load device that is connected to the secondary winding, reflects a signal from the secondary winding back to the primary winding. The reflected signal lowers the potential established at a particular point in the drive circuit to allow a circuit conductive device to effectively establish a new turns ratio with respect to the first and second portions of the primary winding. The new turns ratio operates to induce a lower voltage in the secondary winding, which voltage is still of a sufficient magnitude to hold the load device in its activated condition. Generally then, the aforementioned circuit operates to automatically alter the turns ratio of the drive transformer so as to establish distinct predetermined voltages at the output. These predetermined voltages are of a sufficient magnitude to activate the load device, and to maintain the load device in an activated condition without the constant use of high power and/or high peak currents.

Another circuit of interest is disclosed in U.S. Pat. No. 3,560,821, entitled "Pulse Type Drive Circuit for an Inductive Load", by T. E. Beling. The circuit of the aforementioned patent utilizes a polarizing circuit for returning current from an inductive load back to the source in order to attempt to minimize the fall time associated with the changes in driver current. One of the desired side effects of the subject invention is to greatly decrease the power requirements of the circuit while maintaining a high degree of efficiency.

Another patent of interest is U.S. Pat. No. 3,628,102, entitled "Exciter Apparatus for Impact Member Solenoid", by K. E. Jauch. As part of the driving circuit of the referenced patent, there is provided a protective energy-absorbing network that consists of a resistor and a diode which are connected across the terminals of a solenoid. The resistor and diode combination provide a current path for the inductive, or fly-back current, flowing in the solenoid upon removal of power. As the voltage across the terminals of the solenoid reverse, the energy stored in the inductance of the solenoid attempts to maintain the current flowing in the solenoid, which, in turn, causes the inductor to act as a power supply. The resistor is utilized to dissipate this power. The use of a resistance to dissipate power through heating is an inefficient use of energy; in addition, the resistance also causes a delay in the rise and fall time of the driving voltages associated with the driving of the inductive load.

Four additional patents of interest for showing the state of the art of the inductive driver circuits are: U.S. Pat. No. 3,078,393, entitled "Driver for Inductive Load", by C. R. Winston; U.S. Pat. No. 3,411,045, entitled "Electrical Circuits for Rapidly Driving an Inductive Load", by A. D. Baker et al.; U.S. Pat. No. 3,705,333, entitled "Adjustable Active Clamp Circuit for High-Speed Solenoid Operation", by L. V. Galetto et al.; and finally, U.S. Pat. No. 3,859,572, entitled "Magnetic Coil Driver Circuit", by S. D. Kidl et al.

None of the aforementioned patents attempt to decrease the turn-on and turn-off of an inductance driver by utilizing the properties of a tertiary transformer.

SUMMARY OF THE INVENTION

The present invention is directed to a high-speed inductance driver circuit for driving an inductive load at a high off and on rate while simultaneously providing a means for suppressing the voltage transients normally caused by interruption of a current flowing through an inductor.

In the preferred embodiment of this invention there is utilized a tertiary transformer having its primary winding connected in series to a source of activating power by a switching means. The secondary winding of the transformer is a voltage step-up winding which is connected to an inductive load. The tertiary winding of the transformer is serially connected by a back-biased diode between the power source and the power source return. In operation, the voltage across the primary winding is stepped up by the secondary winding to cause a quicker activation of the inductive load. The diode across the tertiary winding provides for a quick dissipation of the energy contained in the inductive load when the drive current to the primary winding is removed.

The aforementioned circuit finds particular utility in driving an inductive relay or solenoid. The particular circuit is designed to attack two distinct problems. One is that before an electromechanical device can accutate, the current in its inductive coil must increase to a critical level; however, the inductance itself works against the increase causing a delay. In certain applications such as printers, this delay limits the speed at which a message can be printed. Another problem is that, with the device actuated, electrical energy is stored in the inductive field. At turn-off, this energy must be either dissipated or stored without creating damaging voltage spikes. The conventional techniques utilized in circuits of this type for dissipating stored energy do so at the expense of increased turn-off time. This also affects the printing rate by providing or necessitating a longer rest time between each actuation time.

From the above then, it can be shown that it is an object of the present invention to provide an improved inductive driver circuit.

It is another object of the present invention to provide an improved inductive driver circuit having decreased turn-on time and a decreased time for dissipating energy stored within the inductive load.

These and other objects of the present invention will become more apparent when taken in conjunction with the following description and drawing wherein like characters indicate like parts and which drawing forms a part of the present specification.

DESCRIPTION OF THE PREFERRED EMBODIMENT OF THE INVENTION

Figure 1:
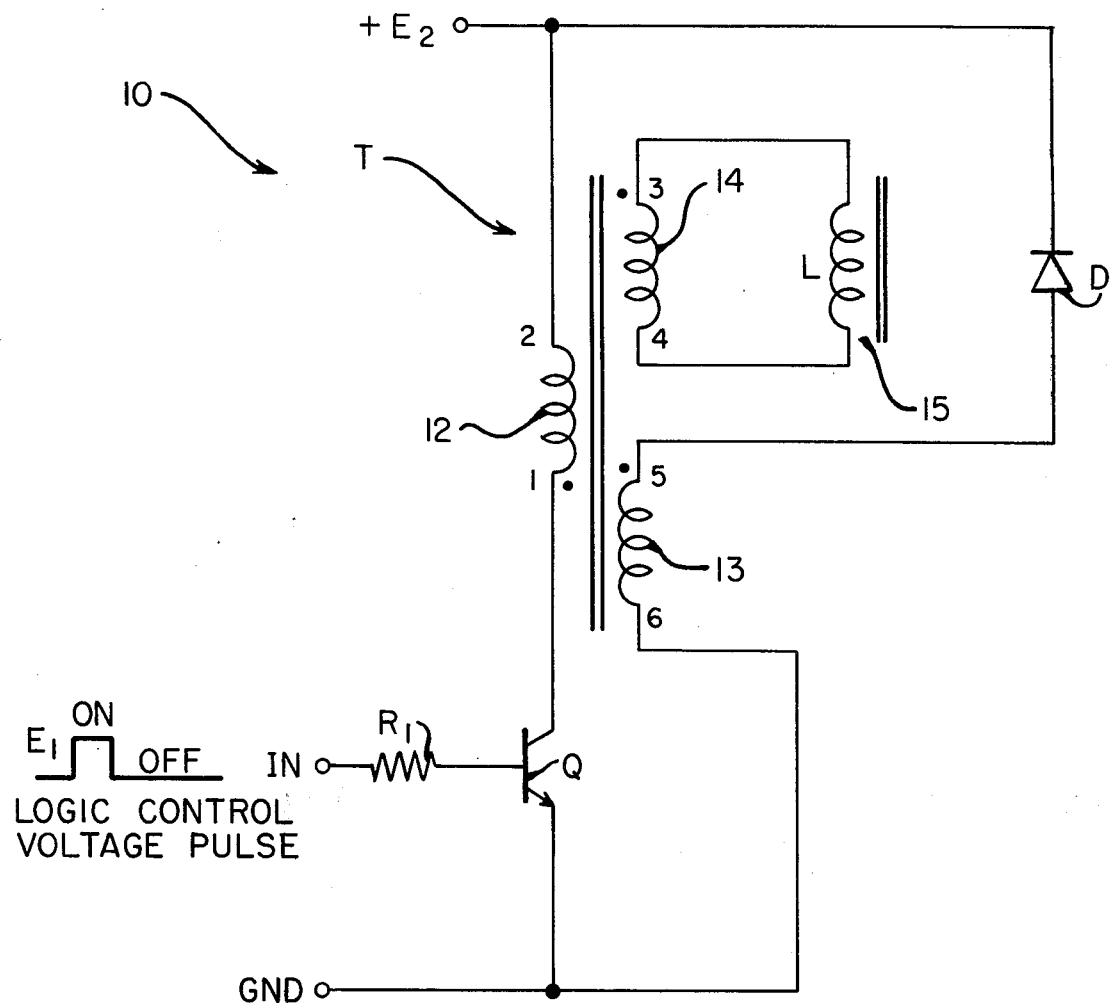
FIG. 1 is a schematic diagram of the preferred embodiment of the invention.

The driver circuit 10 as shown comprised of a switching transistor Q, the base of which is biased on by means of a logic control voltage pulse E, so as to produce a drive current via resistor R, and the reference terminal labelled GND. A unidirectional, DC, power source (not shown for purposes of clarity) provides a source of DC driving power $+E_2$ to the like labelled terminal. A tertiary transformer T having a primary winding 12, secondary winding 14 and a tertiary winding 13, has its primary winding connected in series between the collector of transistor Q and the terminal $+E_2$. The leads from the primary winding of transformer T are labelled 1 and 2. The secondary winding 14 is connected to a load of the inductive or solenoid type 15. The leads of the secondary winding are labelled 3 and 4. The tertiary winding 13 is connected in series between the $+E_2$ terminal and the GND terminal by means of a diode D. The diode D provides a unidirectional current path from the tertiary winding 13 to the terminal $+E_2$. The leads of the tertiary winding 13 are labelled 5 and 6. Dots are provided adjacent the leads labelled 1, 5 and 3 of the primary, secondary, and tertiary windings, respectively. The dots are indicative of the mutual inductance relationship of the windings, one to another.

In the preferred embodiment of the invention the turns ratio of the secondary winding to the primary winding was $N_{34} \div N_{12}$ equal to K. The turns ratio of the tertiary winding to the primary winding is given by the formula $N_{12} \div N_{56}$ is equal to J, where typically J = 1.

In operation, when transistor Q is biased on by the presence of a high signal $E_1$ on the input terminal IN, the voltage applied across the load 15 is $KE_2$. This voltage is caused by the current flowing through the primary winding 12 and the collector-emitter junctions of transistor Q. The voltage across 15 is higher than the voltage $E_2$ due to the turns ratio K between the primary and the secondary windings. The time required for the solenoid to be activated is decreased because the voltage applied to the solenoid reaches a driving level of K times the level of the driving voltage $K_2$. In increasing to this level, the voltage causes the current to rise quickly in the solenoid so as to quickly activate the solenoid. At turn-off the signal on the input terminal drops to a lower level, transistor Q is cut off, and the energy stored in the load 15 causes a current to flow thru the secondary winding, which current is reflected back from the secondary winding to the tertiary winding 13 and, in turn, through the diode D to the $+E_2$ source. The turn-on time varies inversely with the turns-ratio K, while turn-off time varies inversely with the turns-ratio J, i.e.:

$$t_{on} \propto \frac{1}{K}$$

$$t_{off} \propto \frac{1}{J}$$

The compromise on increasing these turns-ratios indefinitely is controlled by the impact on the blocking voltage requirements of the transistor Q and the diode D, viz.:

$$V_{Q_{Max}} = E_2(1 + K)$$

-continued $$V_{D_{Max}} = E_2(1 + J)$$

Typically, $= -1$ and K $=$ 5 are good, but not necessarily the best compromises. In summary then, the aforedescribed circuit provides for fast turn-on and turn-off times while efficiently minimizing the use of power.

While there has been shown what is considered to be the preferred embodiment of the invention, it will be manifest that many changes and modifications may be made therein without departing from the essential spirit of the invention. It is intended, therefore, in the annexed claims to cover all such changes and modifications as may fall within the true scope of the invention.

What is claimed is:

1. A driver circuit comprising:
   a transformer having primary, secondary and tertiary windings;
   a driver switch for connecting a power source in circuit with the primary winding of said transformer;
   an inductive load connected in circuit with the secondary winding of said transformer; and
   unidirectional current means connecting the tertiary winding in circuit to said power source for purposes of directing the energy stored in the inductive load back to the driving source.

2. The driving circuit according to claim 1 wherein said secondary winding steps up voltages present on said primary winding.

3. A driver circuit comprising:
   a unidirectional power source;
   a transformer having primary, secondary and tertiary windings;
   at least one switch means for connecting said power source in circuit with the primary winding of said transformer in response to a driving signal;
   an inductive load connected in circuit with the secondary winding of said transformer; and
   a diode connecting said unidirectional power source in series with said tertiary winding and poled to direct the energy stored in said inductive load back to said unidirectional power source.

4. The driver circuit according to claim 3 wherein the turns ratio between the primary and the secondary winding is approximately 1:5 and between the primary winding and the tertiary winding is approximately 1:1.

5. A drive circuit comprising:
   a terminal connectable to a unidirectional power source;
   a transformer having primary, secondary and tertiary windings, the number of turns in said secondary winding being greater than the number of turns in said primary winding, the number of turns in said tertiary winding being substantially the same as the number of turns in said primary winding;
   at least one switch means for connecting said terminal in circuit with the primary winding of said transformer in response to a driving signal;
   an inductive load connected in circuit with the secondary winding of said transformer; and
   a diode connecting said terminal in series with said tertiary winding and poled to direct the energy stored in said inductive load back to said terminal.

6. The driver circuit according to claim 5 wherein the turns ratio between the primary and the secondary winding is approximately 1:5 and between the primary winding and the tertiary winding is approximately 1:1.

* * * * *

UNITED STATES PATENT AND TRADEMARK OFFICE
CERTIFICATE OF CORRECTION

PATENT NO. : 4,067,055
DATED : January 3, 1978
INVENTOR(S) : Philip W. Koetsch

It is certified that error appears in the above-identified patent and that said Letters Patent are hereby corrected as shown below:

Column 4,

Line 5, delete "= - 1" and insert -- J = 1 --.

Signed and Sealed this

Twenty-eighth Day of March 1978

[SEAL]

Attest:

RUTH C. MASON
Attesting Officer

LUTRELLE F. PARKER
Acting Commissioner of Patents and Trademarks